(12) United States Patent
Lee et al.

(10) Patent No.: US 8,338,941 B2
(45) Date of Patent: Dec. 25, 2012

(54) SEMICONDUCTOR PACKAGES AND METHODS OF FABRICATING THE SAME

(75) Inventors: Jinho Lee, Gwacheon-si (KR); Choongbin Yim, Cheonan-si (KR); Jin-woo Park, Seoul (KR); Dae-young Choi, Yeosu-si (KR); Mi-yeon Kim, Asan-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 195 days.

(21) Appl. No.: 12/805,131

(22) Filed: Jul. 14, 2010

(65) Prior Publication Data

US 2011/0018121 A1      Jan. 27, 2011

(30) Foreign Application Priority Data

Jul. 21, 2009    (KR) .................. 10-2009-0066364

(51) Int. Cl.
*H01L 23/48*    (2006.01)
(52) U.S. Cl. .................. 257/698; 257/E23.011; 438/107
(58) Field of Classification Search .................. 257/692, 257/698, E23.011; 438/107–109
See application file for complete search history.

(56) References Cited

U.S. PATENT DOCUMENTS

| | | | |
|---|---|---|---|
| 2003/0015782 A1* | 1/2003 | Choi et al. | ........... 257/686 |
| 2007/0187810 A1 | 8/2007 | Mok et al. | |
| 2007/0222050 A1 | 9/2007 | Lee et al. | |
| 2007/0252256 A1 | 11/2007 | Lim et al. | |
| 2009/0057899 A1* | 3/2009 | Cheon et al. | ........... 257/738 |

FOREIGN PATENT DOCUMENTS

| | | |
|---|---|---|
| JP | 2007-221118 | 8/2007 |
| JP | 2007-251145 | 9/2007 |
| KR | 10-0753415 | 8/2007 |
| KR | 10-2007-0105553 | 10/2007 |
| KR | 10-0836663 | 6/2008 |

\* cited by examiner

*Primary Examiner* — Julio J Maldonado
*Assistant Examiner* — Daniel Shook
(74) *Attorney, Agent, or Firm* — Harness, Dickey & Pierce, PLC

(57) ABSTRACT

A semiconductor package may include a substrate having first and second surfaces, the second surface including a recessed portion, a first semiconductor chip mounted on the first surface, a first ball land outside the recessed portion, a connection pad inside the recessed portion, a second chip in the recessed portion, the second semiconductor chip including a through via electrically connected to the connection pad, and a second ball land electrically connected to the through via. A semiconductor package may include a substrate having first and second surfaces, the second surface including a recessed portion, a first semiconductor chip mounted on the first surface, a first ball land outside the recessed portion, a connection pad inside the recessed portion, a second semiconductor chip in the recessed portion, the second chip including a through via electrically connected to the connection pad, and a second ball land electrically connected to the through via.

20 Claims, 17 Drawing Sheets

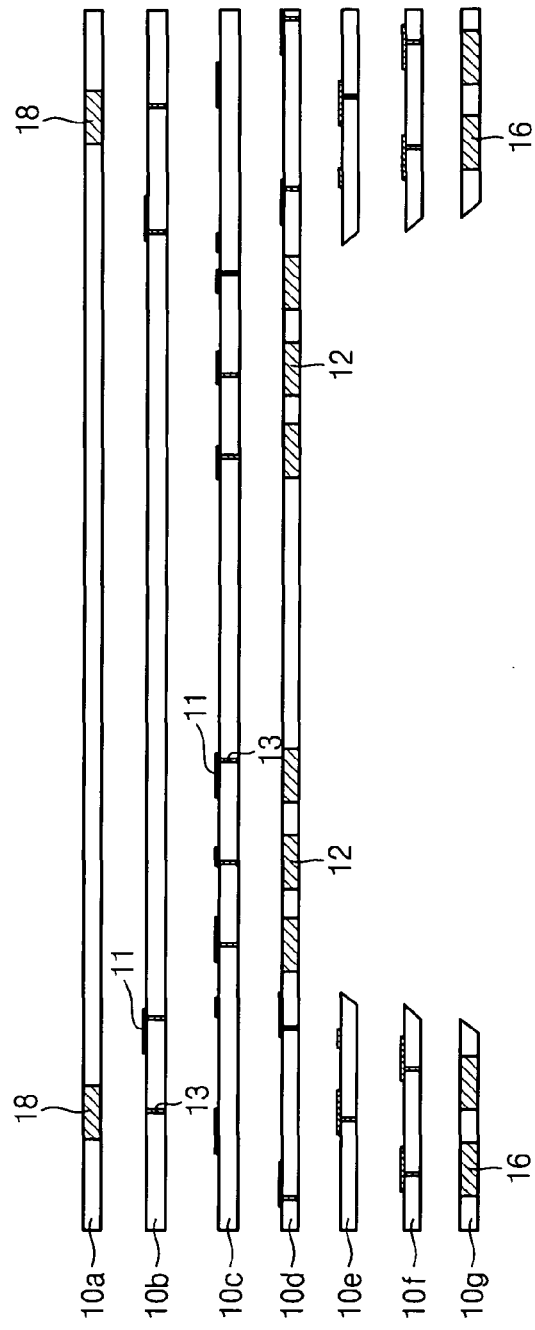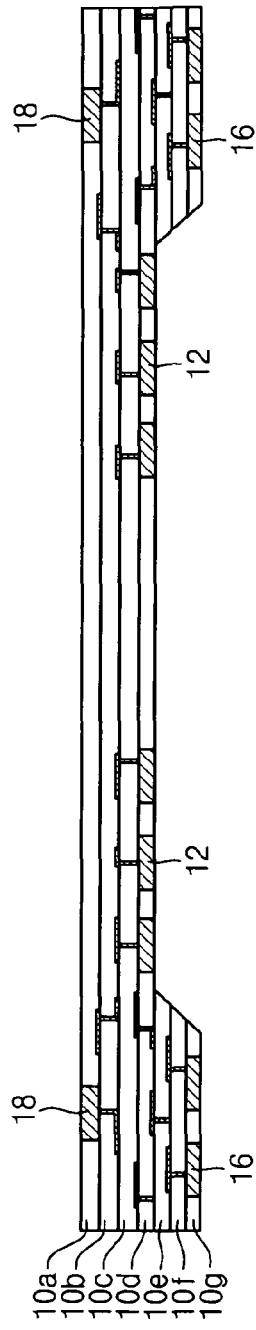
Fig. 7A
Fig. 7B

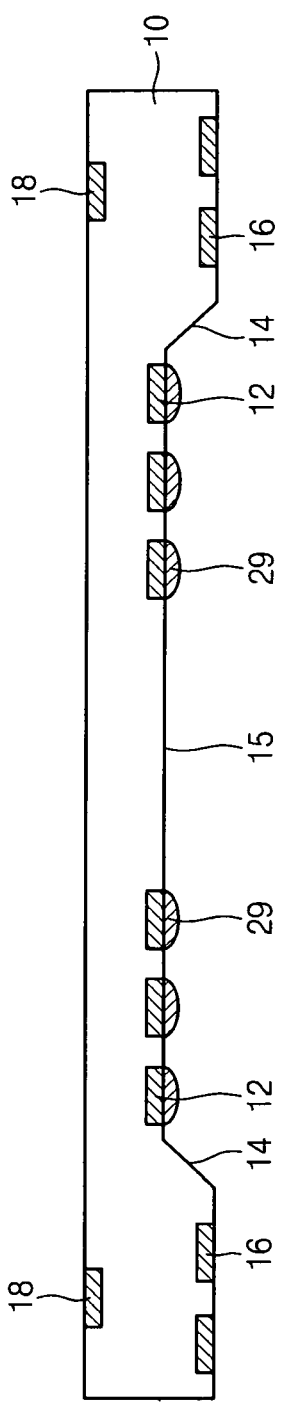
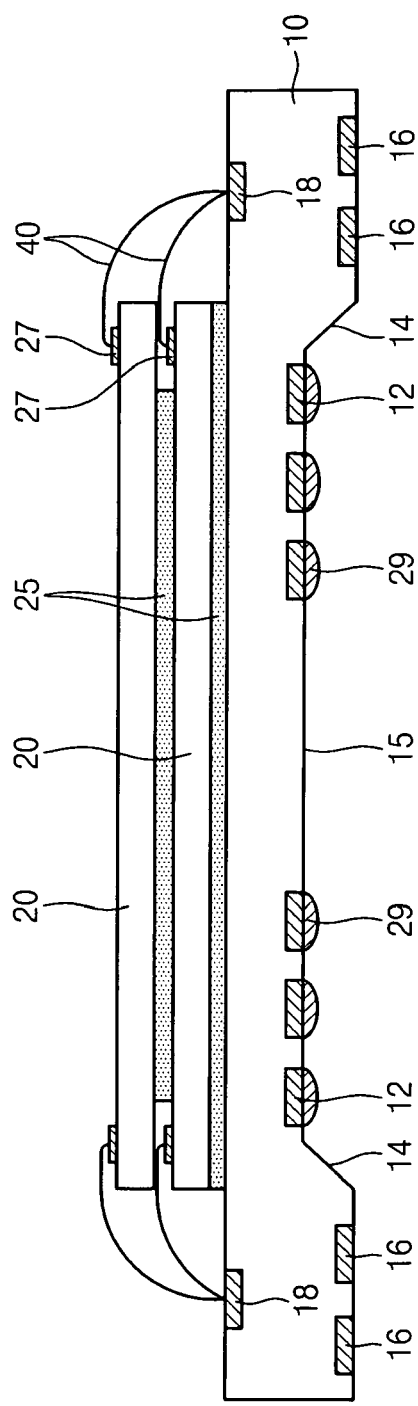

SEMICONDUCTOR PACKAGES AND METHODS OF FABRICATING THE SAME

CROSS-REFERENCE TO RELATED APPLICATION(S)

This application claims priority from Korean Patent Application No. 10-2009-0066364, filed on Jul. 21, 2009, in the Korean Intellectual Property Office (KIPO), the entire contents of which are incorporated herein by reference.

BACKGROUND

1. Field

Example embodiments relate to semiconductor packages. Also, example embodiments relate to methods of fabricating semiconductor packages.

2. Description of the Related Art

With the advance of the electronics industry, demand may exist for electronic components to have higher function, higher speed, and/or smaller size. In accordance with these trends, recently, there may be methods of laminating and/or mounting various semiconductor chips on one semiconductor substrate and/or laminating another package on a package as techniques for mounting semiconductors. However, these methods may have problems in that the thickness of the entire package may be greater and/or bonding stability may deteriorate. Furthermore, in such methods, as the thickness of the laminated packages may increase, the overall wiring path may become longer and/or the overall electric resistance may increase, either or both of which may decrease speed.

SUMMARY

Example embodiments may provide semiconductor packages that may reduce the thickness of an entire package.

Example embodiments may provide semiconductor packages that may realize high-speed devices.

Example embodiments may provide semiconductor packages that may provide sufficient external connection terminals.

Example embodiments may provide methods of fabricating semiconductor packages that may easily select excellent memory packages and/or excellent logic packages.

According to example embodiments, a semiconductor package may include a base substrate having a first surface and a second surface opposite to each other, the second surface being provided with a recessed portion, a first semiconductor chip mounted onto the first surface, a first ball land located in a region other than the recessed portion in the second surface, a connection pad located inside the recessed portion in the second surface, a second semiconductor chip being inserted into the recessed portion and/or including a through via electrically connected to the connection pad, and/or a second ball land electrically connected to the through via.

In example embodiments, the semiconductor package may further include a protection layer filling a gap between the second surface and the second semiconductor chip in the recessed portion.

In example embodiments, a sidewall of the recessed portion may be inclined.

In example embodiments, the first semiconductor chip may be a memory chip and/or the second semiconductor chip may be a logic chip.

In example embodiments, the semiconductor package may further include a first solder ball coming in contact with the first ball land and/or a second solder ball coming in contact with the second ball land. The first solder ball may have the same size as that of the second solder ball or may have a different size from that of the second solder ball.

In example embodiments, the semiconductor package may further include a bump interposed between the redistribution pad and the connection pad. The redistribution pad may be connected to the through via and/or may extend so as to be close to the connection pad.

In example embodiments, the first semiconductor chip may be electrically connected to the base substrate by one or more of wire bonding, flipchip bonding, and a through via or vias.

According to example embodiments, a semiconductor package may include a base substrate having a first surface and a second surface opposite to each other, the second surface being provided with an internal terminal, a first semiconductor chip mounted onto the first surface, a second semiconductor chip being mounted onto the second surface and including a through via electrically connected to the internal terminal, a first external terminal disposed in the second surface of the base substrate, and/or a second external terminal disposed in the second semiconductor chip.

In example embodiments, the semiconductor package may further include a recessed portion formed in the second surface of the base substrate.

In example embodiments, the first external terminal and/or the second external terminal may be solder balls. The solder balls may have the same size or different sizes.

According to example embodiments, a method of fabricating a semiconductor package may include forming a first sub-package that may include a first semiconductor chip, a base substrate having the first semiconductor chip mounted on an upper surface and a recessed portion formed in a lower surface, a first ball land located at a region other than the recessed portion in the lower surface, and/or a first sub-package including a connection pad located in the recessed portion, forming a second sub-package that may include a second semiconductor chip having a through via and/or a second ball land electrically connected to the through via, and/or inserting the second sub-package into the recessed portion of the first sub-package and/or electrically connecting the connection pad to the through via.

In example embodiments, the method may further include forming a protection layer that fills a gap or gaps between the first sub-package and the second sub-package.

In example embodiments, the forming of the first sub-package may include forming a first solder ball that comes in contact with the first ball land, and/or the forming of the second sub-package may include forming a second solder ball that comes in contact with the second ball land.

In example embodiments, the method may further include testing the first sub-package and/or the second sub-package before the connection pad is electrically connected to the through via.

In example embodiments, a semiconductor package may include a base substrate having a first surface and a second surface opposite to each other, wherein the second surface may include a recessed portion, a first semiconductor chip mounted on the first surface, a first ball land outside the recessed portion of the second surface, a connection pad inside the recessed portion of the second surface, a second semiconductor chip in the recessed portion, wherein the second semiconductor chip may include a through via electrically connected to the connection pad, and/or a second ball land electrically connected to the through via.

In example embodiments, a semiconductor package may include a base substrate having a first surface and a second surface opposite to each other, wherein the second surface may include a first terminal, a first semiconductor chip mounted on the first surface, a second semiconductor chip mounted on the second surface, wherein the second semiconductor chip may include a through via electrically connected to the first terminal, a second terminal in the second surface of the base substrate, and/or a third terminal in the second semiconductor chip.

In example embodiments, a method of fabricating a semiconductor package may include forming a first sub-package that may include a first semiconductor chip, a base substrate having the first semiconductor chip mounted on an upper surface of the base substrate and a recessed portion formed in a lower surface of the base substrate, a first ball land at a region other than the recessed portion, and/or a connection pad located in the recessed portion, forming a second sub-package that may include a second semiconductor chip having a through via and a second ball land electrically connected to the through via, and/or inserting the second sub-package into the recessed portion of the first sub-package and electrically connecting the connection pad to the through via.

BRIEF DESCRIPTION OF THE DRAWINGS

The above and/or other aspects and advantages will become more apparent and more readily appreciated from the following detailed description of example embodiments, taken in conjunction with the accompanying drawings, in which:

FIG. 1 is seen from the bottom;

FIGS. 6, 8, and 9 are sectional views sequentially illustrating a process of fabricating the first sub-package of FIG. 3;

FIGS. 7A and 7B are sectional views sequentially illustrating a process of fabricating a base substrate of FIG. 6;

DETAILED DESCRIPTION

Figure 1:
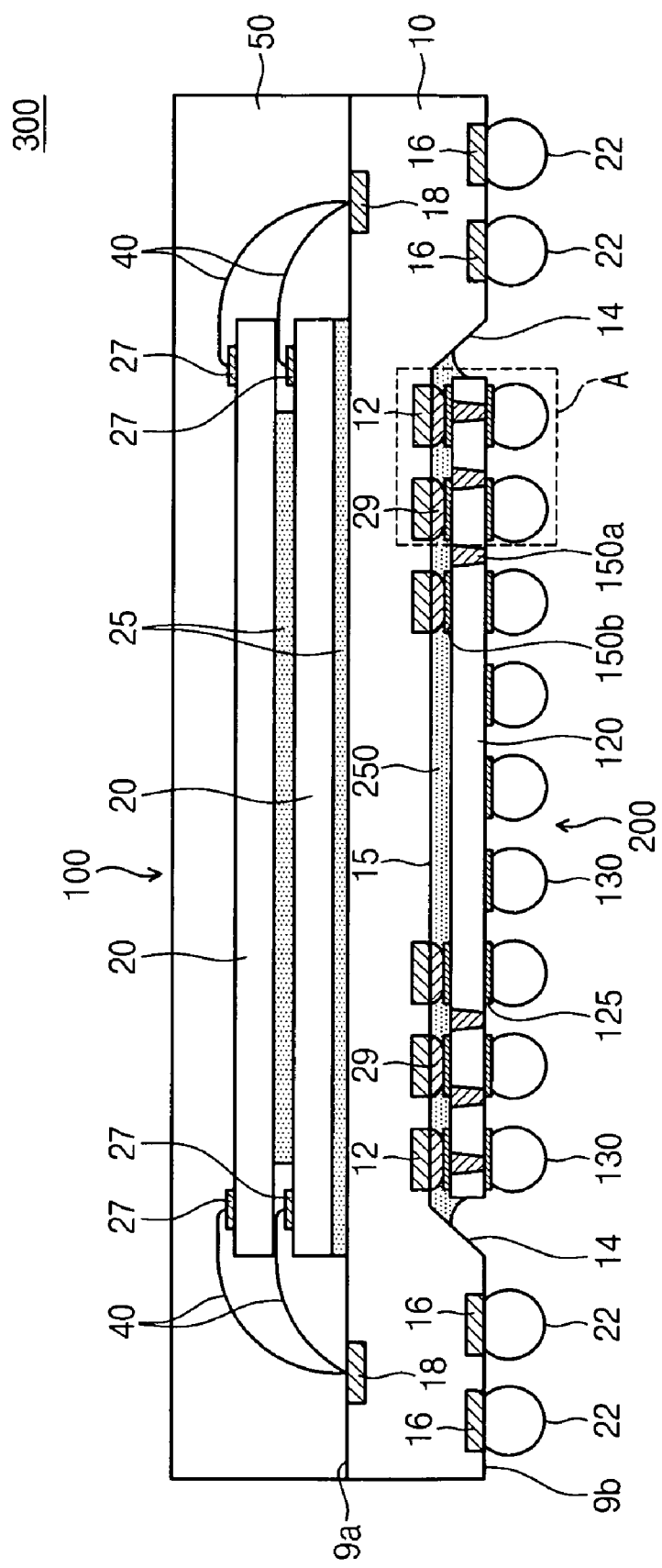
FIG. 1 is a sectional view of a semiconductor package according to example embodiments.

Example embodiments will now be described more fully with reference to the accompanying drawings. Embodiments, however, may be embodied in many different forms and should not be construed as being limited to the embodiments set forth herein. Rather, these example embodiments are provided so that this disclosure will be thorough and complete, and will fully convey the scope to those skilled in the art. In the drawings, the thicknesses of layers and regions are exaggerated for clarity.

It will be understood that when an element is referred to as being "on," "connected to," "electrically connected to," or "coupled to" to another component, it may be directly on, connected to, electrically connected to, or coupled to the other component or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings, wherein like reference numerals may refer to like components throughout.

Figure 2:
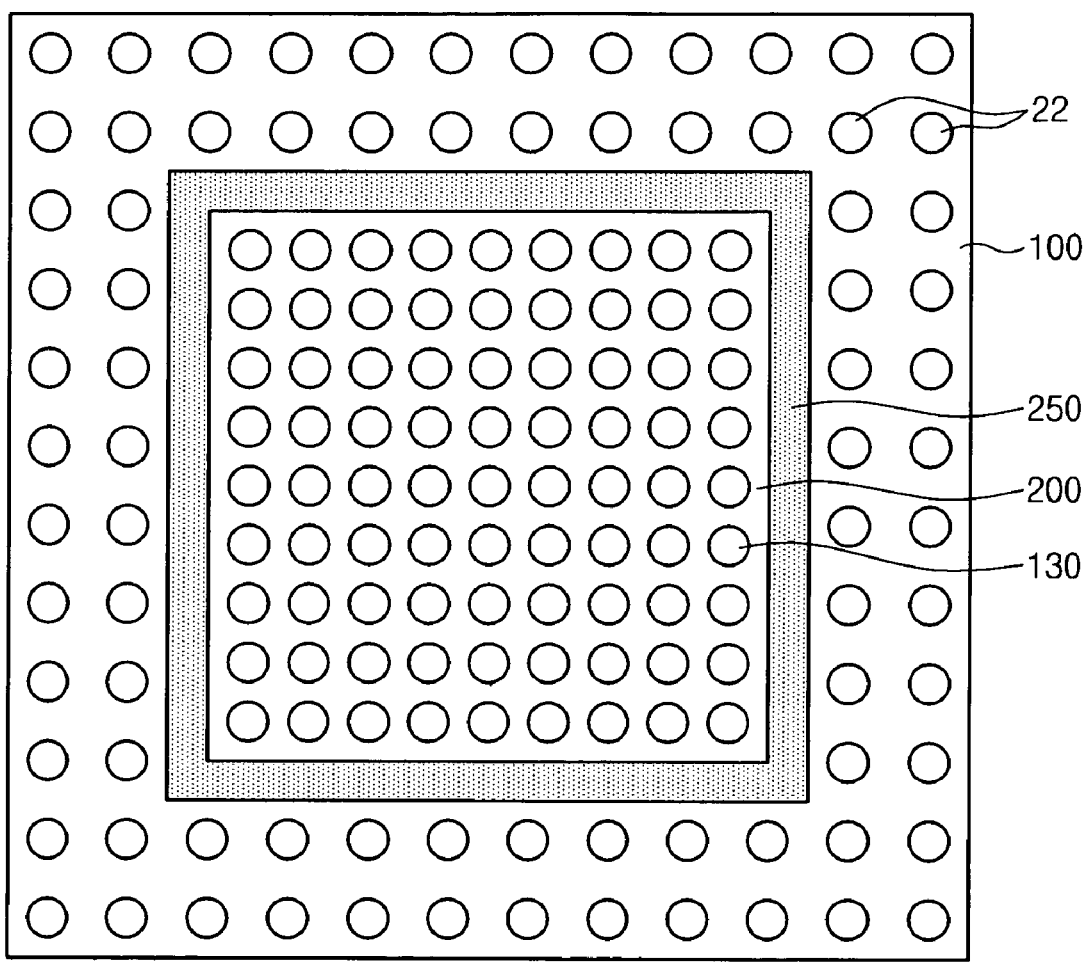
FIG. 2 is a plan view when
Figure 3:
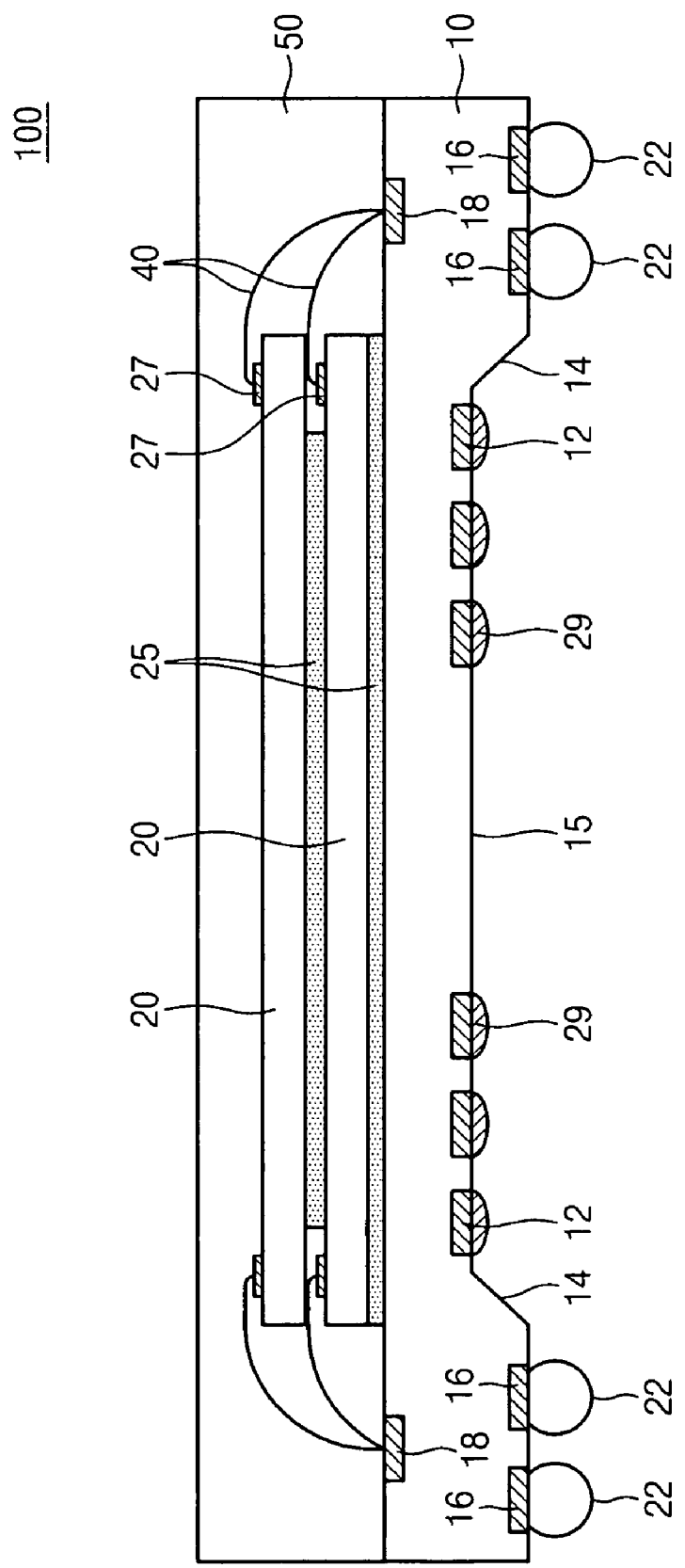
FIG. 3 is a sectional view of a first sub-package of FIG. 1.
Figure 4:
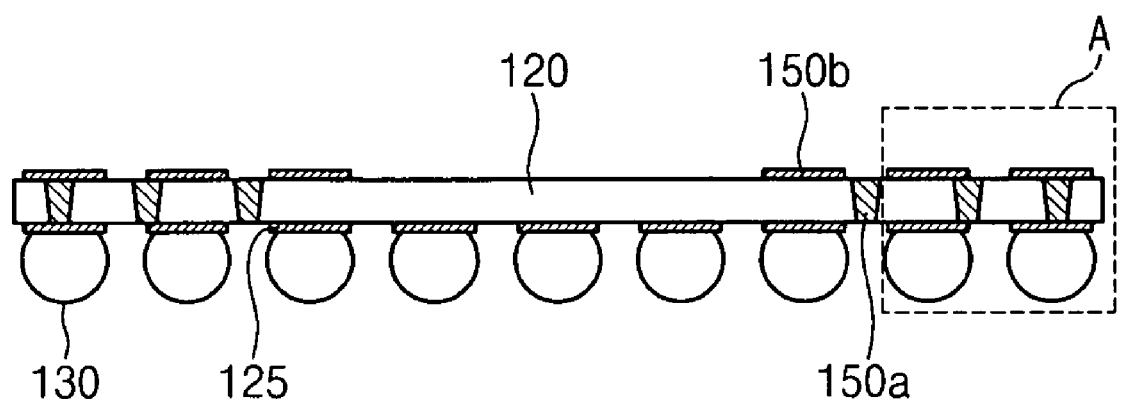
FIG. 4 is a sectional view of a second sub-package of FIG. 1.

FIG. 1 is a sectional view illustrating a semiconductor package according to a first embodiment of the inventive concept. FIG. 2 is a plan view when FIG. 1 is seen from the bottom. FIG. 3 is a sectional view of first sub-package 100 of FIG. 1. FIG. 4 is a sectional view of second sub-package 200 of FIG. 1.

With reference to FIGS. 1 through 4, semiconductor package 300 according to example embodiments may include first sub-package 100 and/or second sub-package 200. First sub-package 100 may include base substrate 10 that may include first surface 9a and second surface 9b opposite to each other, and/or recessed portion 15 formed in a center portion or a side portion of second surface 9b. First surface 9a may be an upper surface. Second surface 9b may be a lower surface. Recessed portion 15 may preferably include inclined sidewall 14. Base substrate 10 may not include recessed portion 15. First semiconductor chips 20 may be mounted onto first surface 9a of base substrate 10. In FIG. 1, two first semiconductor chips 20 may be mounted, but the number of first semiconductor chips 20 may be one or three or more. First surface 9a of base substrate 10 may be provided with first connection pads 18 that may be electrically connected to first semiconductor chips 20. First connection pads 18 may be disposed along the circumference of first semiconductor chips 20. First semiconductor chips 20 may be the same kind of memory chips, for example, memory chips having the same capacity. First semiconductor chips 20 may be laminated on base substrate 10 and/or may be attached and/or fixed to each other through adhesive 25. In example embodiments, first semiconductor chips 20 may be electrically connected to first connection pads 18 by wire bonding. That is, chip pads 27 of first semiconductor chips 20 may be connected to first connection pads 18 by wires 40.

First semiconductor chips 20, wires 40, upper surface of base substrate 10, and/or first connection pads 18 may be covered with molding layer 50. Molding layer 50 may be formed, for example, of an epoxy-based material. In second surface 9b of base substrate 10, first ball lands 16 may be disposed in a region other than recessed portion 15. Second connection pads 12 may be disposed inside recessed portion 15 in second surface 9b. First connection pads 18 may be electrically connected to a part or each of first ball lands 16 and/or second connection pads 12. Wires (not illustrated) electrically connecting first connection pads 18 to first ball lands 16 and/or second connection pads 12 may be disposed inside base substrate 10. Bump 29 may be attached to each of second connection pads 12, and/or first solder ball 22 may be attached to each of first ball lands 16.

Subsequently, second sub-package 200 may be inserted into recessed portion 15 of first sub-package 100. Second sub-package 200 may include second semiconductor chip 120. Second semiconductor chip 120 may be, for example, a logic chip. Second semiconductor chip 120 may include plural through vias 150a perforating therein. Through vias 150a may be, for example, silicon through vias. The lower surface of second semiconductor chip 120 may be provided with second ball lands 125 that may be electrically connected to through vias 150a. The upper surface of second semiconductor chip 120 may be provided with redistribution pads 150b that may be connected to through vias 150a. The lower portion of each of second ball lands 125 may be provided with second solder ball 130. Second sub-package 200 may be inserted into recessed portion 15 so as to be bonded to first sub-package 100. The bonding may be performed in such a manner that bump 29 of first sub-package 100 and/or redistribution pads 150b of second sub-package 200 may be bonded to each other by, for example, a fusion bonding. In recessed portion 15, a space between base substrate 10 of first sub-package 100 and second semiconductor chip 120 of second sub-package 200 may be filled with protection layer 250. Protection layer 250 protects semiconductor package 300 from external factors such as moisture or shock, thereby improving durability. Protection layer 250 may be formed, for example, of an epoxy-based material.

Figure 5:
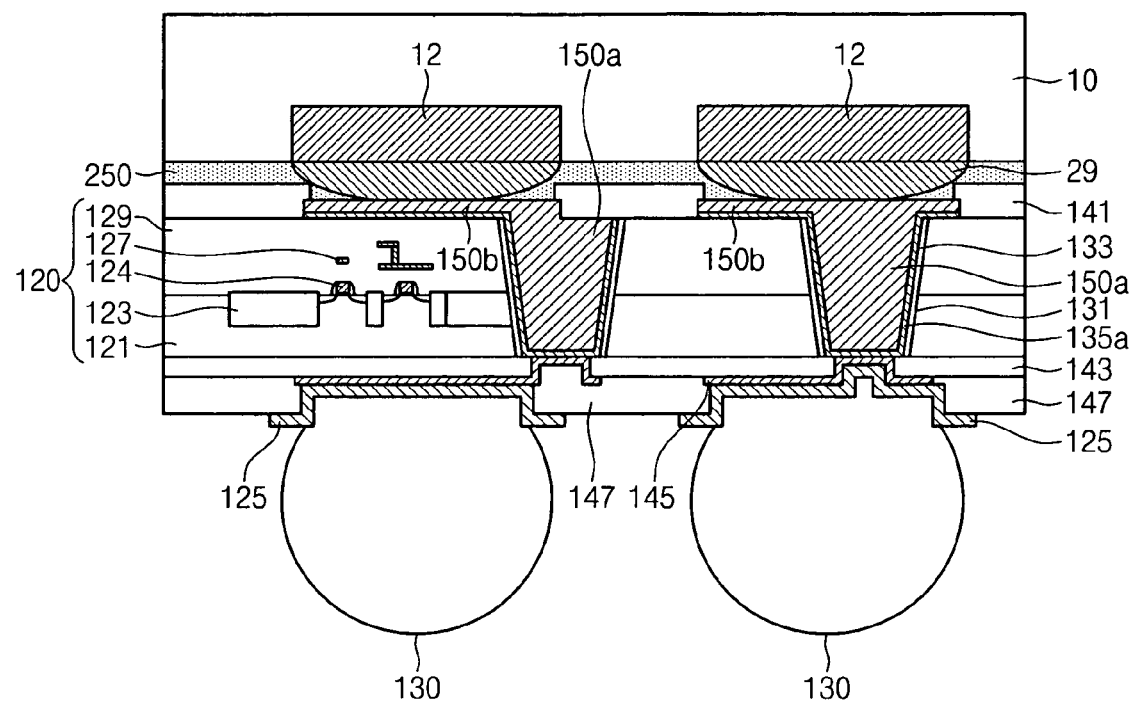
FIG. 5 is an enlarged sectional view of a portion A of FIG. 1.

FIG. 5 is an enlarged sectional view of portion A of FIG. 1. With reference to FIG. 5, the inside of second sub-package 200 will be described. First, second semiconductor chip 120 may include plural device isolation layers 123, transistors 124, wirings 127, and/or insulation layers 129, that may be formed on semiconductor substrate 121. Via holes 131 perforating second semiconductor chip 120 may be formed. Each through via 150a may be disposed inside of a respective via hole 131. The upper surface of second semiconductor chip 120 may be provided with redistribution pads 150b that may extend from through via 150a. Seed layer pattern 135a may be interposed between redistribution pad 150b and insulation layer 129, and/or between through via 150a and the sidewall of via hole 131. Insulation spacer 133 may be interposed between seed layer pattern 135a and the sidewall of via hole 131. The upper surface of second semiconductor chip 120 may be provided with first passivation layer 141 that may expose a part of redistribution pad 150b, and/or the lower surface of second semiconductor chip 120 may be provided with second passivation layer 143 that may expose seed layer pattern 135a and/or may cover semiconductor substrate 121. The lower surface of second passivation layer 143 may be provided with redistribution line 145 that may be connected to seed layer pattern 135a and/or may extend to a region (that may or may not be predetermined) so as to be connected to second ball land 125. A part of redistribution line 145 may be covered with third passivation layer 147. Since second ball land 125 may be electrically connected to through via 150a by redistribution line 145, second ball land 125 may not be overlapped with through via 150a.

Semiconductor package 300 according to example embodiments will be described with reference to FIGS. 1 through 5. Since second sub-package 200 may be inserted into recessed portion 15 of first sub-package 100, the thickness of entire semiconductor package 300 may be substantially the same as the thickness of first sub-package 100. The vertical position (for example, a height) of first ball land 16 may be the same as the vertical position of second ball land 125, and/or the vertical position (for example, a height) of first solder ball 22 may be the same as the vertical position of second solder ball 130. In addition, since semiconductor package 300 according to example embodiments may have through via 150a formed inside second semiconductor chip 120, the length of the electric path between second connection pad 12 and second ball land 125 may become shorter than it otherwise might be. Accordingly, the electric signal may be rapidly transmitted between first sub-package 100 and second sub-package 200, thereby realizing the high-speed device. In addition, since second solder ball 130 may be disposed on the lower portion of second sub-package 200 by through via 150a, as illustrated in FIG. 2, external connection terminals such as first solder ball 22 and second solder ball 130 may be disposed on most of the lower surface of entire semiconductor package 300. Accordingly, it may be possible to realize multi-functions of the device. The sizes of first solder ball 22 and second solder ball 130 may be the same or different.

Hereinafter, the process of fabricating semiconductor package 300 will be described.

First, the process of fabricating first sub-package 100 will be described with reference to FIGS. 6, 8, and 9.

Figure 6:
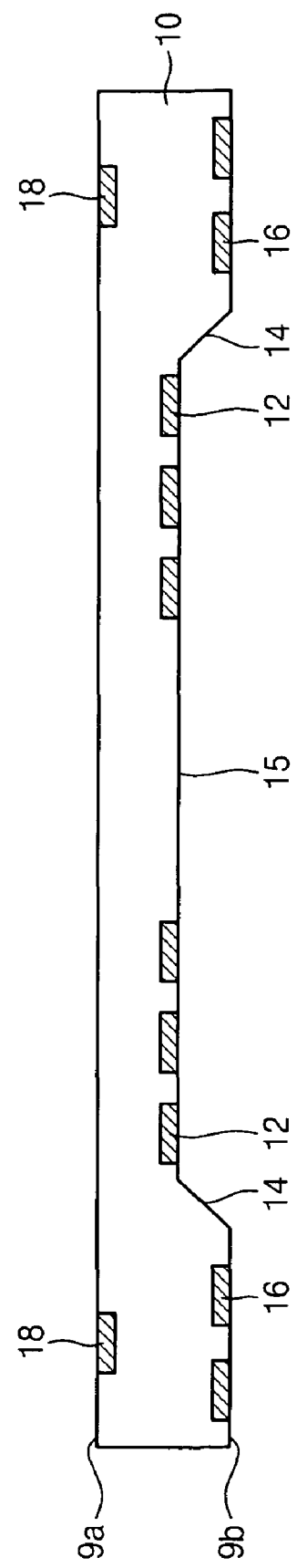

With reference to FIG. 6, base substrate 10 may be formed. Base substrate 10 may be provided with first connection pad 18, second connection pad 12, and/or first ball land 16. Base substrate 10 may be a printed circuit board formed of various materials. For example, base substrate 10 may be a printed circuit board formed of ceramic. In this case, base substrate 10 may be formed by a low temperature co-fired ceramic process. In detail, base substrate 10 including recessed portion 15 may be formed, for example, by laminating and/or co-firing at least two layers of sub-ceramic sheets. At least one of the at least two layers may have an opening at the center portion thereof, and subsequently the opening may form recessed portion 15. This will be described in more detail with reference to FIGS. 7A and 7B.

With reference to FIG. 7A, first through seventh sub-ceramic sheets 10a through 10g may be formed (in example embodiments, more or less sub-ceramic sheets may be formed and/or used), internal via pattern 13 may be formed by punching and/or filling each of sub-ceramic sheets 10a through 10g, and/or internal wiring patterns 11 forming a circuit may be printed on the surface of each of sub-ceramic sheets 10a through 10g. Upon printing internal wiring patterns 11, first connection pad 18, second connection pad 12, and/or first ball land 16 may be formed on each of first, fourth, and seventh sub-ceramic sheets 10a, 10d, and 10g in the same manner (in example embodiments, internal wiring patterns 11 and/or second connection pads 12 may be formed on one or more other sub-ceramic sheets, particularly if more or less sub-ceramic sheets may be formed and/or used). Accordingly, first connection pad 18, second connection pad 12, and/or first ball land 16 may be formed to have the same thickness as those of internal wiring patterns 11. In the drawings, the thicknesses of first connection pad 18, second connection pad 12, and/or first ball land 16 may be exaggerated for clarity. In example embodiments, the openings having inclined sidewalls may be formed at the center portions of fifth through seventh sub-ceramic sheets 10e through 10g (in example embodiments, the openings having inclined sidewalls may be formed on one or more other sub-ceramic sheets, particularly if more or less sub-ceramic sheets may be formed and/or used).

With reference to FIGS. 6 and 7B, sub-ceramic sheets 10a through 10g may be sequentially laminated and pressed. Then, the co-firing may be performed to form base substrate 10 of FIG. 6. Although not illustrated (or omitted) in FIG. 6, internal wiring pattern 11 and/or internal via pattern 13 may be disposed inside base substrate 10, so that all or part of first connection pads 18, second connection pads 12, and/or first ball lands 16 may be electrically connected to each other.

With reference to FIG. 8, bump 29 may be formed on the lower surface of each of second connection pads 12. Bump 29 may be formed in a shape of a metal post by, for example, electroplating. Alternatively, bump 29 may have a shape of a round solder ball by a reflow process after the electroplating.

With reference to FIG. 9, first semiconductor chip 20 may be attached to the center portion of first surface 9a of base substrate 10 using adhesive 25, and/or chip pad 27 may be connected to first connection pad 18 by wire 40. This process may be performed one more time, so that two first semiconductor chips 20 may be mounted onto base substrate 10.

With reference to FIG. 3 again, molding layer 50 may be formed, for example, of an epoxy-resin-based material on base substrate 10 by a molding process. Then, first solder ball 22 may be attached to the lower surface of first ball land 16, thereby forming first sub-package 100.

Next, the process of forming second sub-package 200 of FIG. 4 will be described with reference to FIGS. 10A through 10E. FIGS. 10A through 10E are enlarged sectional views corresponding to portion A of FIG. 4.

Figure 10A:
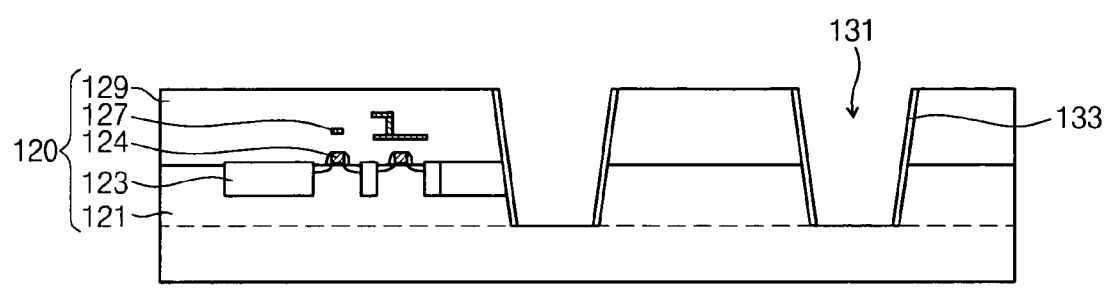
FIGS. 10A, 10B, 10C, 10D, and 10E are enlarged sectional views sequentially illustrating a process of fabricating the second sub-package of FIG. 4.

First, with reference to FIG. 10A, plural via holes 131 may be formed in a wafer including second semiconductor chip 120 provided with plural device isolation layers 123, transistors 124, wirings 127, and/or insulation layers 129 on semiconductor substrate 121 so as to have a depth in which the wafer may not be perforated. Via holes 131 may be formed by using, for example, a laser. After an insulation layer may be formed on the upper surface of the wafer including via holes 131, insulation spacer 133 may be formed at the sidewalls of via holes 131 by an etch back process.

Figure 10B:
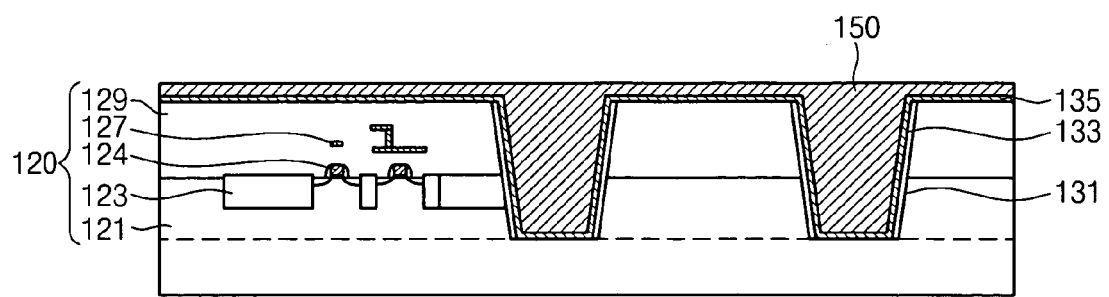

With reference to FIG. 10B, seed layer 135 may be formed on the front surface of the wafer provided with insulation spacer 133, and/or metal layer 150 may be formed by, for example, electroplating to fill via hole 131.

Figure 10C:
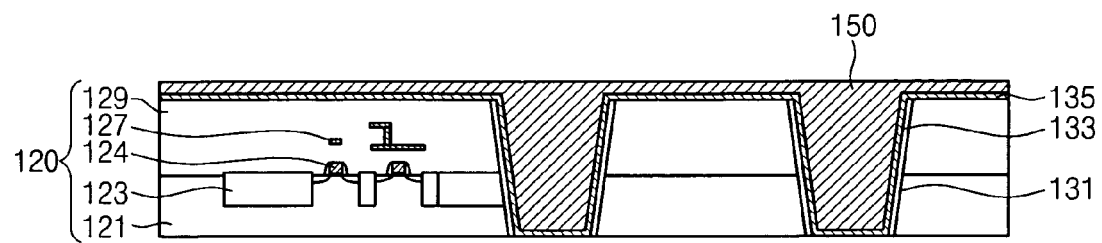

With reference to FIG. 10C, grinding may be performed on the lower surface of the wafer so as to remove part of semiconductor substrate 121 and to expose seed layer 135 of the bottom of via hole 131.

Figure 10D:
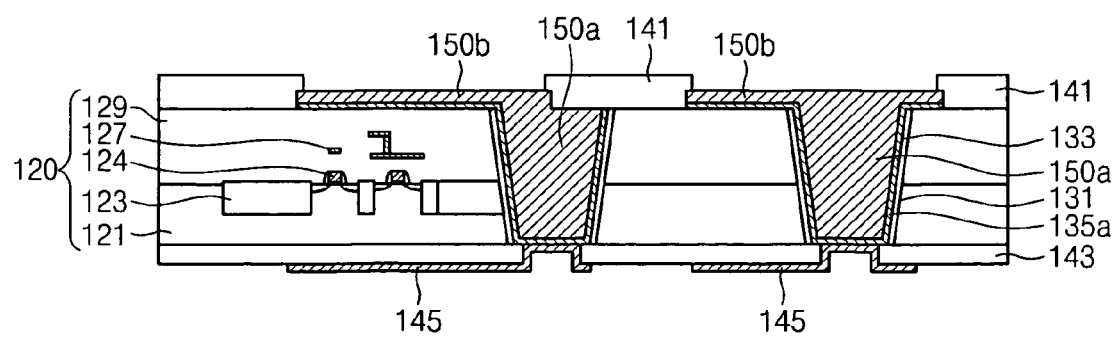

With reference to FIG. 10D, patterning may be performed on part of metal layer 150 and/or seed layer 135 to form through via 150a located inside via hole 131, redistribution pad 150b connected to through via 150a and/or extending to a part of the upper surface of second semiconductor chip 120, and/or seed layer pattern 135a. First passivation layer 141 may be formed on the upper surface of second semiconductor chip 120 to expose part of redistribution pad 150b. Then, second passivation layer 143 may be formed to cover the lower surface of second semiconductor chip 120 and/or to expose seed layer pattern 135a of the bottom of via hole 131. Then, redistribution line 145 connected to seed layer pattern 135a may be formed in the lower portion of second passivation layer 143.

Figure 10E:
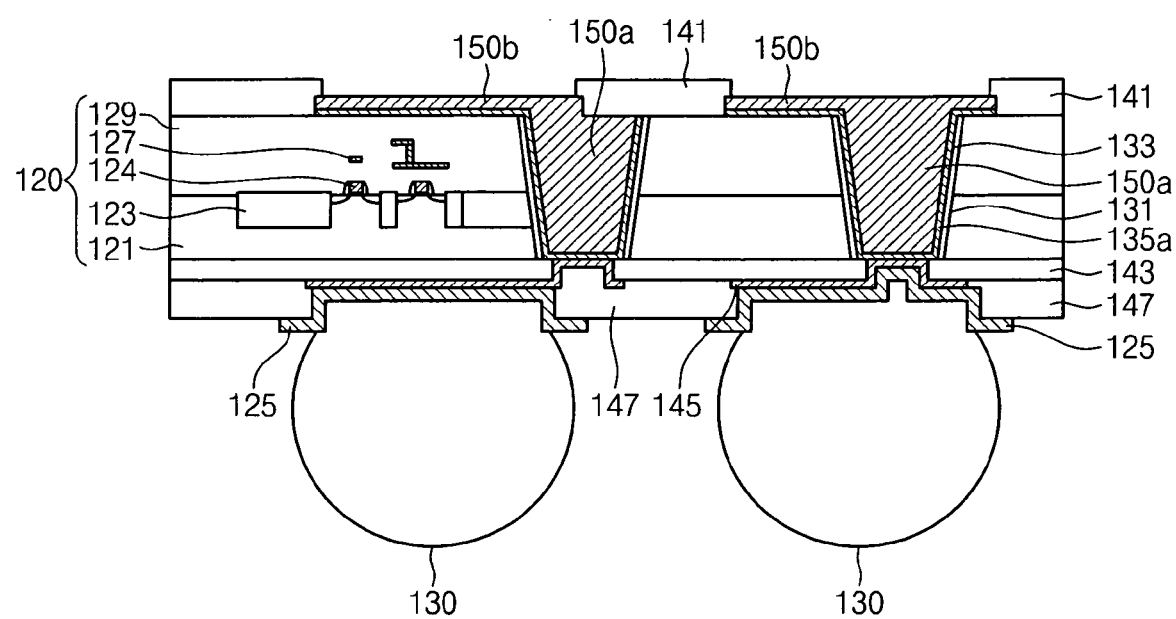

With reference to FIG. 10E, third passivation layer 147 may be formed to expose a part of redistribution line 145 and/or to cover the lower surface of second passivation layer 143. Then, second ball land 125 may be formed to come in contact with redistribution line 145, and/or second solder ball 130 may be attached to the lower portion of second ball land 125, thereby forming second sub-package 200 of FIG. 4.

Likewise, after first sub-package 100 and/or second sub-package 200 may be formed, first sub-package 100 and second sub-package 200 may be bonded to each other. Before the bonding, first sub-package 100 and/or second sub-package 200 may be tested to detect defects. If there is a defect or are defects, first sub-package 100 and/or second sub-package 200 may be exchanged with first sub-package 100 and/or second sub-package 200 without any defect, and the bonding may be performed. The bonding will be described with reference to FIGS. 1 and 5.

With reference to FIGS. 1 and 5, second sub-package 200 may be inserted into recessed portion 15 of first sub-package 100. Then, after redistribution pad 150b of second sub-package 200 may be located to come into contact with bump 29 of first sub-package 100, redistribution pad 150b may be fused to bump 29 by a reflow process. Subsequently, protection layer 250 may be filled between first sub-package 100 and second sub-package 200 inside recessed portion 15 by an underfill process. Protection layer 250 may be formed, for example, of an epoxy-resin-based material. Since inclined sidewall 14 of recessed portion 15 may be inclined, it may be possible to easily move a nozzle for supplying material of protection layer 250 to a close position during the underfill process, and/or to easily supply material of protection layer 250.

Figure 11:
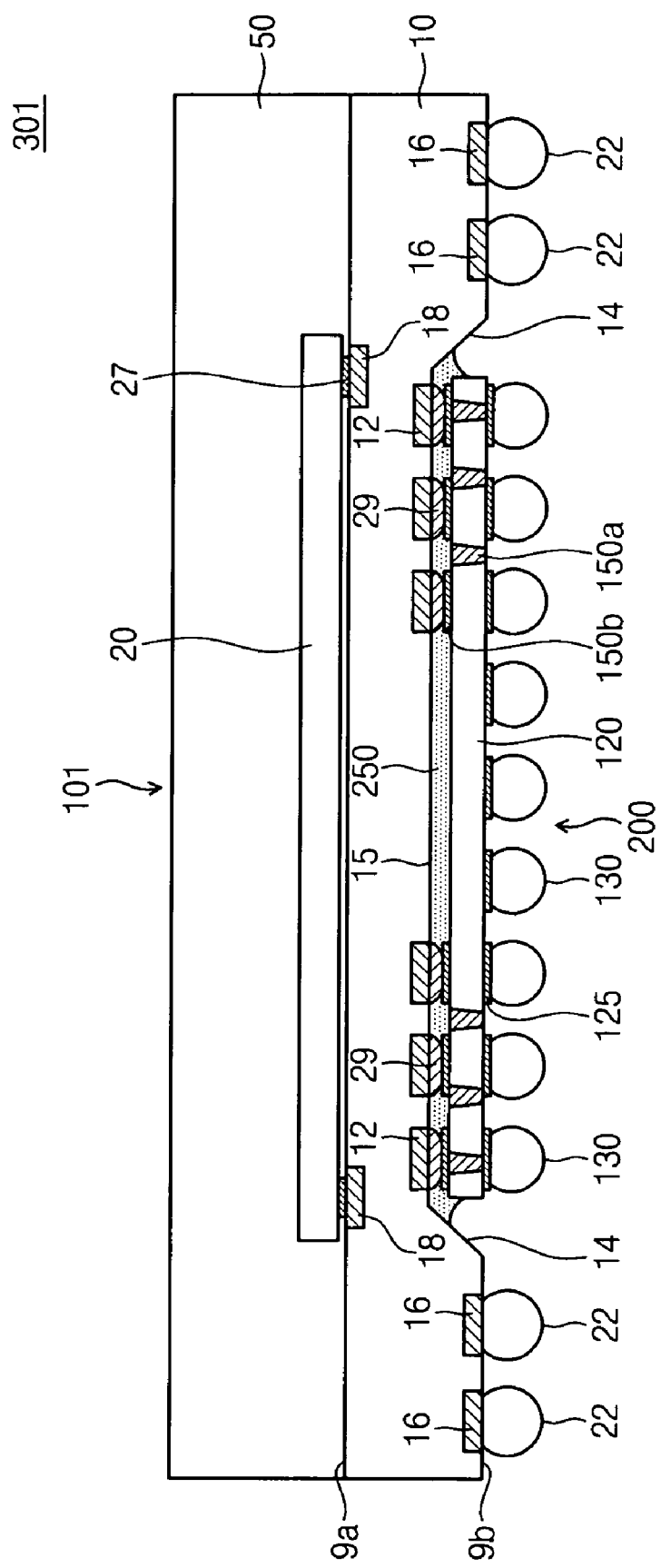
FIG. 11 is a sectional view of a semiconductor package according to example embodiments.

FIG. 11 is a sectional view of a semiconductor package according to example embodiments.

With reference to FIG. 11, second sub-package 200 of semiconductor package 301 according to example embodiments may be similar, but flipchip bonding may be performed between first semiconductor chip 20 and first connection pad 18 of base substrate 10 in first sub-package 101. That is, chip pad 27 of first semiconductor chip 20 may be directly connected to first connection pad 18.

Figure 12:
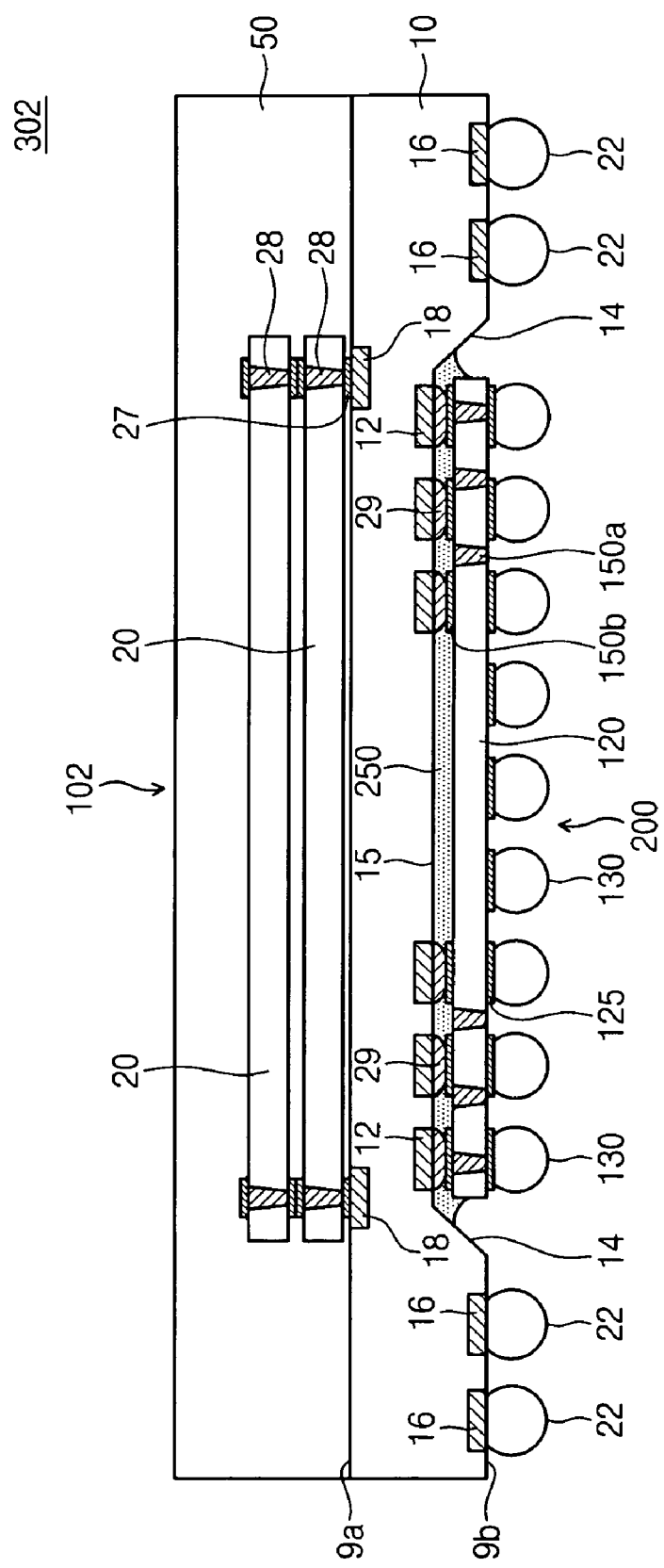
FIG. 12 is a sectional view of a semiconductor package according to example embodiments.

FIG. 12 is a sectional view of a semiconductor package according to example embodiments.

With reference to FIG. 12, second sub-package 200 of semiconductor package 302 according to example embodiments may be similar, but first semiconductor chip 20 of first sub-package 102 may have through electrode 28 and/or chip pad 27, connected to through electrode 28, may be connected to first connection pad 18 through flipchip bonding.

Figure 13:
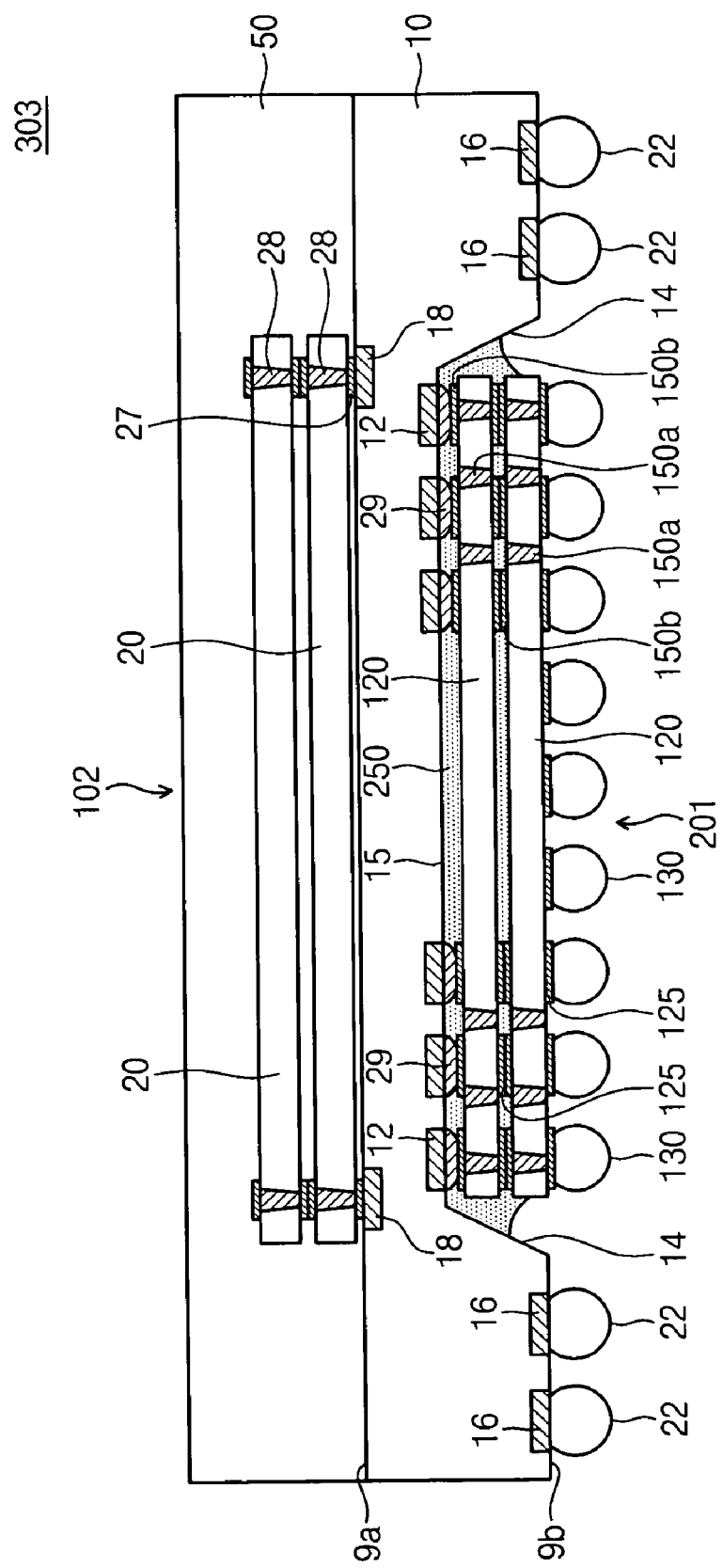
FIG. 13 is a sectional view of a semiconductor package according to example embodiments.

FIG. 13 is a sectional view of a semiconductor package according to example embodiments.

With reference to FIG. 13, first sub-package 102 of semiconductor package 303 according to example embodiments may be similar, but second sub-package 201 may include two laminated second semiconductor chips 120. It may be desirable that the vertical size (for example, a depth or a height) of recessed portion 15 of first sub-package 102 may be set to accommodate two laminated second semiconductor chips 120. Between two second semiconductor chips 120, second ball land 125 and redistribution pad 150b may be directly connected to each other or another bump may be interposed between them. Then, second solder ball 130 may be attached to second ball land 125 of second semiconductor chip 120 disposed below.

In example embodiment, two second semiconductor chips 120 may be laminated, but two or more second semiconductor chips 120 may be laminated, and/or the vertical size of recessed portion 15 may increase in accordance with the number of laminated second semiconductor chips 120.

The configurations of the example embodiments may be combined.

The above-described semiconductor package technology may be applied to various semiconductor devices and/or package modules having the same.

Figure 14:
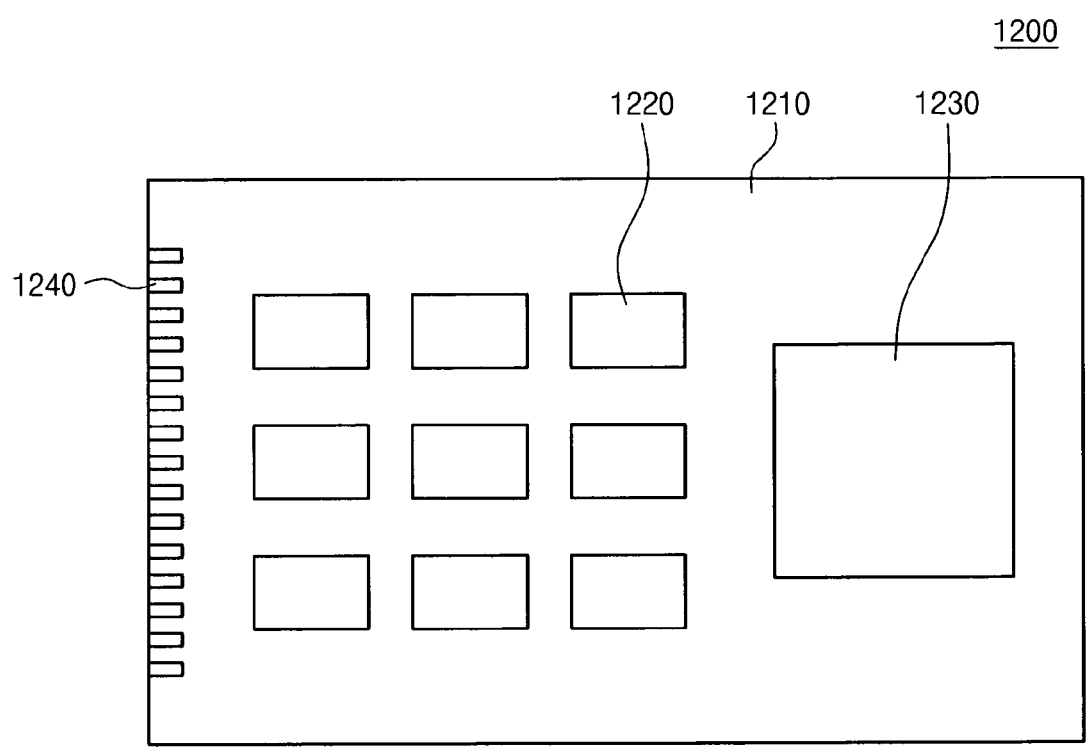
FIG. 14 is a diagram illustrating an example of a package module including the semiconductor package according to example embodiments.

FIG. 14 is a diagram illustrating an example of the package module including the semiconductor package according to example embodiments. With reference to FIG. 14, package module 1200 may be provided in the form of semiconductor chip 1230 in which semiconductor integrated circuit 1220 and/or a Quad Flat Package (QFP) may be packaged. By installing semiconductor integrated circuit 1220 and/or semiconductor chip 1230 on substrate 1210, it may be possible to form package module 1200. Package module 1200 may be connected to an external electronic apparatus through external connection terminal 1240 provided on one side of substrate 1210.

Figure 15:
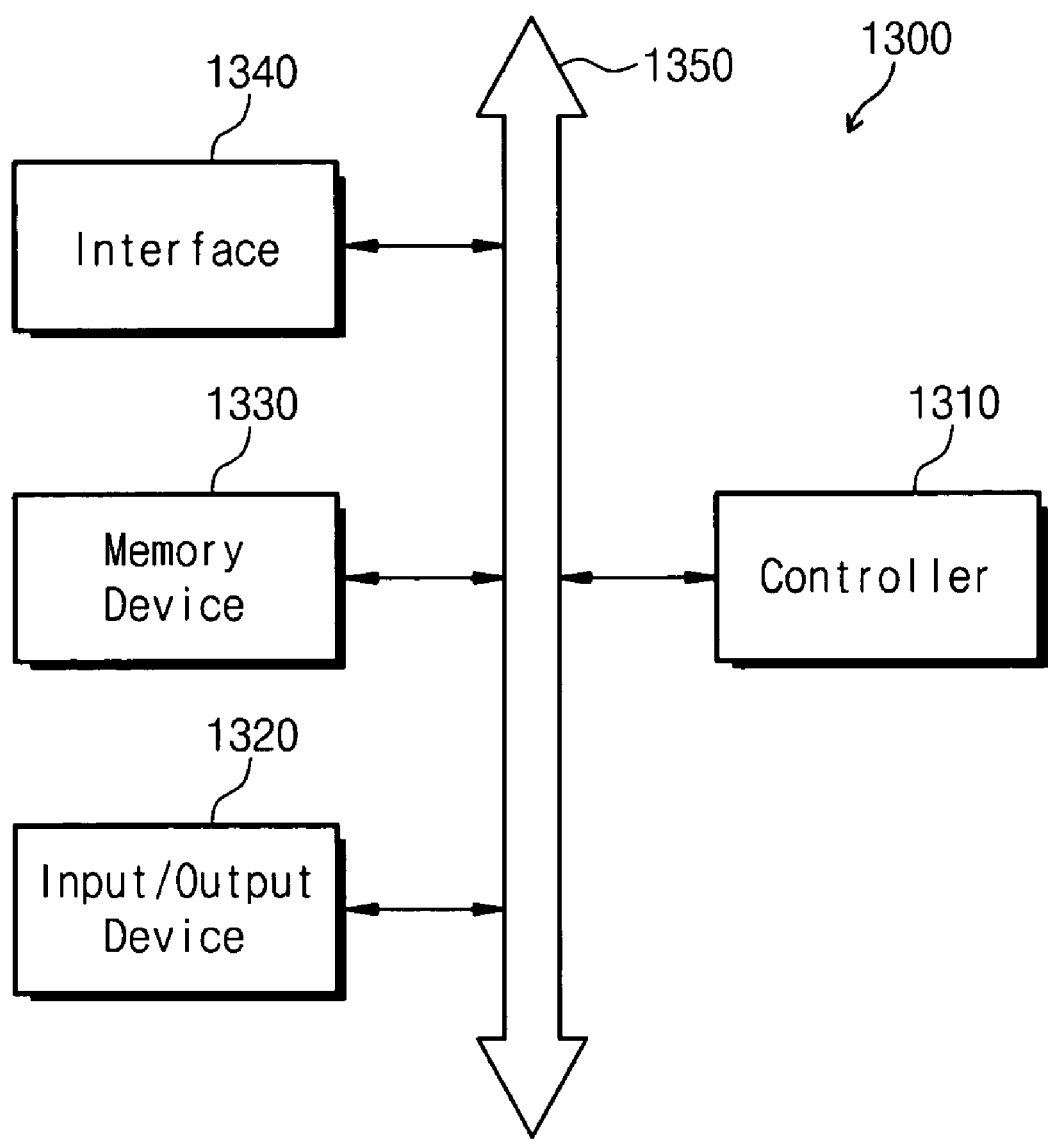
FIG. 15 is a block diagram illustrating an example of an electronic apparatus including the semiconductor package according to example embodiments.

The above-described semiconductor package technology may be applied to an electronic system. FIG. 15 is a block diagram illustrating an example of an electronic apparatus including a semiconductor device according to example embodiments. With reference to FIG. 15, electronic system 1300 may include controller 1310, input/output device 1320, and/or memory device 1330. Controller 1310, input/output device 1320, and/or memory device 1330 may be connected through bus 1350. Bus 1350 may be a transfer path of data. For example, controller 1310 may include at least one of a microprocessor, a digital signal processor, a microcontroller, and at least one of logic devices capable of performing the same functions thereof. Controller 1310 and/or memory device 1330 may include the semiconductor package according to the inventive concept. Input/output device 1320 may include at least one selected from a keypad, a keyboard, a display device, and the like. Memory device 1330 may be a device for storing data. Memory device 1330 may be capable of storing data and/or a command executed by controller 1310. Memory device 1330 may include a volatile memory device and/or a nonvolatile memory device. Alternatively, memory device 1330 may be configured as a flash memory. For example, the flash memory adopting the technology of the inventive concept may be attached to an information processing system such as a mobile device or a desktop computer. The flash memory may be configured as an SSD (Semiconductor Disk Device). In this case, electronic system 1300 may be capable of reliably storing a mass data in the flash memory. Electronic system 1300 may further include interface 1340 for transmitting or receiving data to or from a communication network. Interface 1340 may be a wire/wireless type. For example, interface 1340 may include an antenna or a wire/wireless transceiver. Then, although not illustrated in the drawings, it may be apparent to those skilled in the art that electronic system 1300 may further include an application chipset, a Camera Image Processor (CIS), an input/output device, and the like.

Electronic system 1300 may be realized as a mobile system, a personal computer, an industrial computer, or a logic system performing various functions. For example, the mobile system may be any one of a Personal Digital Assistant (PDA), a portable computer, a web tablet, a mobile phone, a wireless phone, a laptop computer, a memory card, a digital music system, and an information transmitting/receiving system. In the case where electronic system 1300 is an equipment capable of performing a wireless communication, electronic system 1300 may be used by a communication interface protocol of a third generation communication system such as Code Division Multiple Access (CDMA), Global System for Mobile Communications (GSM), North American Digital Cellular (NADC), Extended Time Division Multiple Access (E-TDMA), Wideband Code Division Multiple Access (WCDAM), and/or CDMA 2000.

Figure 16:
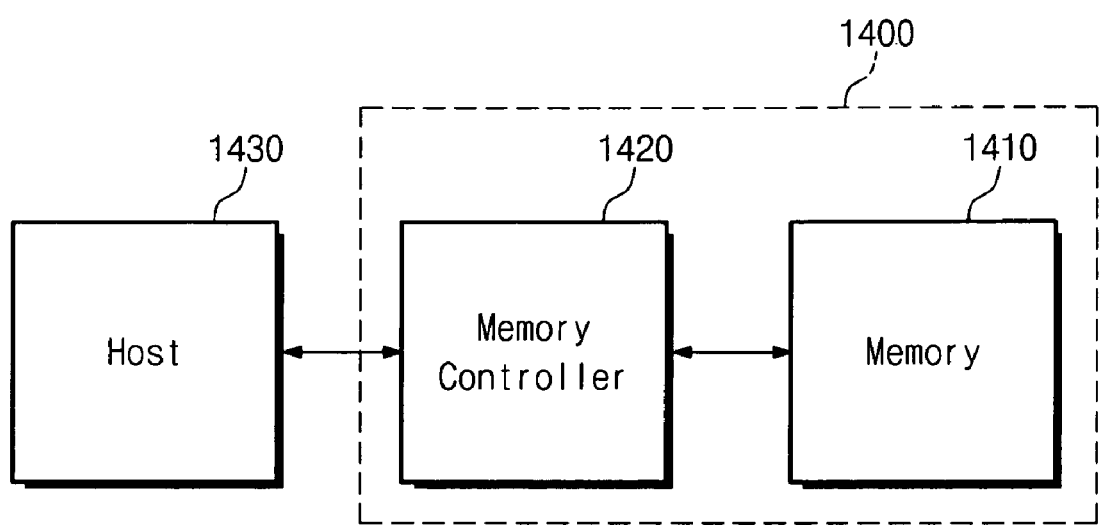
FIG. 16 is a block diagram illustrating an example of a memory system including the semiconductor package according to example embodiments.

The above-described semiconductor device adopting the technology of the inventive concept may be provided in the form of a memory card. FIG. 16 is a block diagram illustrating an example of a memory system including the semiconductor device according to example embodiments. With reference to FIG. 16, memory card 1400 may include nonvolatile memory device 1410 and/or memory controller 1420. Nonvolatile memory device 1410 and/or memory controller 1420 may be capable of storing data or reading stored data. Nonvolatile memory device 1410 may include at least any one of the nonvolatile memory devices according to example embodiments. Memory controller 1420 may be capable of controlling nonvolatile memory device 1410 so that stored data may be read and/or data may be stored in response to a reading/writing request of host 1430.

In the semiconductor package according to example embodiments, since the second sub-package may be inserted into the recessed portion of the first sub-package, it may be possible to reduce the thickness of the entire package. In addition, since the second semiconductor chip of the second sub-package may include the through via, the length of the electrical connection path may become shorter. As a result, it may be possible to realize high-speed devices. Furthermore, since the second semiconductor chip of the second sub-package may include the through via, the external connection terminal, such as a solder ball, may be disposed at the lower portion of the second sub-package, thereby providing the sufficient external connection terminals.

In the method of fabricating the semiconductor package according to example embodiments, furthermore, after the first sub-package and the second sub-package, which may be provide with the solder balls, may be separately formed, the two sub-packages may be bonded. Accordingly, it may be relatively easy to remove the poor sub-package through the test process before the bonding.

While example embodiments have been particularly shown and described, it will be understood by those of ordinary skill in the art that various changes in form and details may be made therein without departing from the spirit and scope of the present invention as defined by the following claims.

What is claimed is:

1. A semiconductor package, comprising:
   a base substrate having a first surface and a second surface opposite to each other, wherein the second surface includes a recessed portion;
   a first semiconductor chip mounted on the first surface;
   a first ball land outside the recessed portion of the second surface;
   a connection pad of the base substrate inside the recessed portion of the second surface;
   a second semiconductor chip in the recessed portion, wherein the second semiconductor chip includes a through via electrically connected to the connection pad; and
   a second ball land electrically connected to the through via.

2. The semiconductor package of claim 1, further comprising:
   a protection layer filling a gap, in the recessed portion, between the second surface and the second semiconductor chip.

3. The semiconductor package of claim 1, wherein a sidewall of the recessed portion is inclined.

4. The semiconductor package of claim 1, wherein the first semiconductor chip is a memory chip, and wherein the second semiconductor chip is a logic chip.

5. The semiconductor package of claim 1, further comprising:
   a first solder ball in contact with the first ball land; and
   a second solder ball in contact with the second ball land;
   wherein the first solder ball has a same size as the second solder ball.

6. The semiconductor package of claim 1, further comprising:
   a first solder ball in contact with the first ball land; and
   a second solder ball in contact with the second ball land;
   wherein the first solder ball has a different size than the second solder ball.

7. The semiconductor package of claim 1, wherein the second semiconductor chip further includes a redistribution pad connected to the through via and extended adjacent to the connection pad, and
   wherein the semiconductor package further includes a bump interposed between the redistribution pad and the connection pad.

8. The semiconductor package of claim 1, wherein the first semiconductor chip is electrically connected to the base substrate by one or more of wire bonding, flipchip bonding, and a through electrode or electrodes.

9. A semiconductor package, comprising:
   a base substrate having a first surface and a second surface opposite to each other, wherein the second surface includes a recessed portion and a first terminal inside the recessed portion;
   a first semiconductor chip mounted on the first surface;
   a second semiconductor chip mounted on the second surface, wherein the second semiconductor chip includes a through via electrically connected to the first terminal;
   a second terminal in the second surface of the base substrate; and
   a third terminal in the second semiconductor chip.

10. The semiconductor package of claim 9, wherein the first terminal is an internal terminal.

11. The semiconductor package of claim 9, wherein the second terminal is an external terminal.

12. The semiconductor package of claim 9, wherein the third terminal is an external terminal.

13. The semiconductor package of claim 9,
    wherein the second semiconductor chip is mounted in the recessed portion.

14. The semiconductor package of claim 9, wherein the second terminal and the third terminal are solder balls having a same size.

15. The semiconductor package of claim 9, wherein the second terminal and the third terminal are solder balls having different sizes.

16. A method of fabricating a semiconductor package, the method comprising:
    forming a first sub-package that includes a first semiconductor chip, a base substrate having the first semiconductor chip mounted on an upper surface of the base substrate and a recessed portion formed in a lower surface of the base substrate, a first ball land at a region other than the recessed portion, and a connection pad of the base substrate located in the recessed portion;
    forming a second sub-package that includes a second semiconductor chip having a through via and a second ball land electrically connected to the through via; and
    inserting the second sub-package into the recessed portion of the first sub-package and electrically connecting the connection pad to the through via.

17. The method of claim 16, further comprising:
    forming a protection layer that fills a gap between the first sub-package and the second sub-package.

18. The method of claim 16, further comprising:
    forming a protection layer that fills a gap, in the recessed portion, between the first sub-package and the second sub-package.

19. The method of claim 16, wherein forming the first sub-package includes forming a first solder ball that is in contact with the first ball land, and
    wherein forming the second sub-package includes forming a second solder ball that is in contact with the second ball land.

20. The method of claim 16, further comprising:
    testing the first sub-package before the connection pad is electrically connected to the through via; and
    testing the second sub-package before the connection pad is electrically connected to the through via.

* * * * *